United States Patent [19]
Landry

[11] Patent Number: 6,134,181
[45] Date of Patent: Oct. 17, 2000

[54] CONFIGURABLE MEMORY BLOCK

[75] Inventor: Greg J. Landry, Merrimack, N.H.

[73] Assignee: Cypress Semiconductor Corp., San Jose, Calif.

[21] Appl. No.: 09/257,468

[22] Filed: Feb. 24, 1999

[51] Int. Cl.[7] .................................................. G11C 8/00
[52] U.S. Cl. ...................................... 365/233; 365/230.03
[58] Field of Search ................................ 365/233, 230.03

[56] References Cited

U.S. PATENT DOCUMENTS 5,384,745  1/1995  Konishi et al. ..................... 365/230.03

Primary Examiner—David Nelms
Assistant Examiner—M. Tran
Attorney, Agent, or Firm—Christopher P. Maiorana, P.C.

[57] ABSTRACT

A circuit and method comprising a memory array and a plurality of address circuits. The memory may comprise a plurality of storage elements each configured to read and write data in response to an internal address signal. The plurality of address circuits may each be configured to generate one of said internal address signals in response to (i) an external address signal, (ii) a clock signal and (iii) a control signal.

20 Claims, 3 Drawing Sheets

CONFIGURABLE MEMORY BLOCK

FIELD OF THE INVENTION

The present invention relates to memories generally and, more particularly, to an embedded memory that may be configured to operate in a number of modes.

BACKGROUND OF THE INVENTION

Conventional embedded memory devices are typically synchronous in nature. A synchronous design, such as a synchronous SRAM, will not generally consume current when the clock to the block is not switching. Such designs, when implemented in embedded memories, are typically implemented with a fixed word-width.

One disadvantage with such a conventional approach is that it is not as flexible as a truly asynchronous device, which can be configured to operate either asynchronously or synchronously. For example, an asynchronous SRAM can be used to implement a logic function by using the address inputs as the logic function inputs, the data output(s) as the logic function output(s), and the memory bits as a lookup table for the output values for a given set of input values.

SUMMARY OF THE INVENTION

The present invention concerns a circuit and method comprising a memory and a plurality of address circuits. The memory array may comprise a plurality of storage elements each configured to read and write data in response to an internal address signal. The plurality of address circuits may each be configured to generate one of said internal address signals in response to (i) an external address signal, (ii) a clock signal and (iii) a control signal.

The objects, features and advantages of the present invention include providing a memory block that may be configured to operate having (i) asynchronous inputs and outputs, (ii) synchronous inputs (e.g., synchronous flowthrough), (iii) synchronous outputs, (iv) synchronous inputs and outputs (e.g., pipelined), (v) a number of bit widths (e.g., ×32, 33 16, ×8, ×4, ×2, ×1), (vi) a Read Only Memory (ROM) mode, and/or (vii) a mode implementing a logic function.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
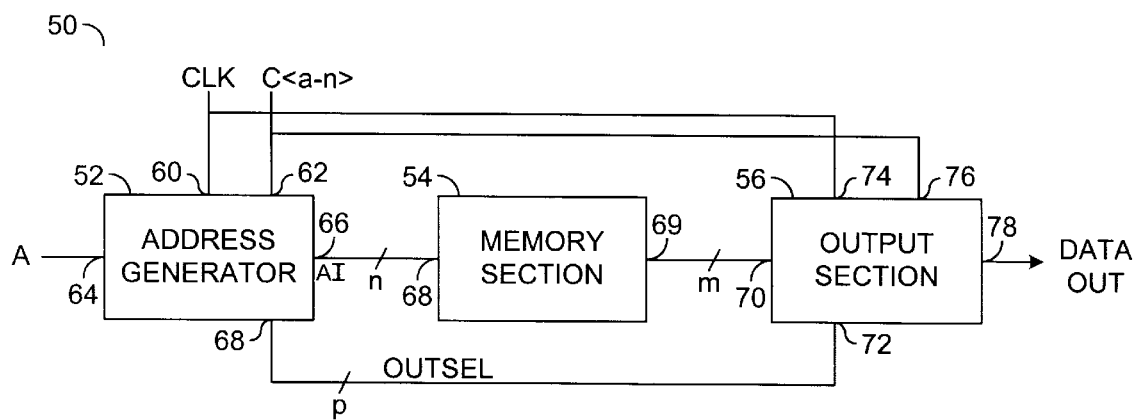
FIG. 1 is block a diagram of a preferred embodiment of the present invention.

Referring to FIG. 1, a block diagram of a circuit 50 is shown in accordance with a preferred embodiment of the present invention. The circuit 50 generally comprises an address generator block (or circuit) 52, a memory section (or circuit) 54 and an output section (or circuit) 56. The address generator circuit 52 may have an input 60 that may receive a clock signal (e.g., CLK), an input 62 that may receive a control signal (e.g., C<a–n>), an input 64 that may receive an external address signal (e.g., A), an output 66 that may present an internal address signal (e.g., AI) and an output 68 that may present an output selection signal (e.g., OUTSEL). The memory section 54 may have an input 68 that may receive the internal address signal AI and an output 69 that may present data signals to an input 70 of the output section 56. The output section 56 may also include an input 74 that may receive the signal CLK, an input 76 that may receive the control (or configuration) signal C<a–n>, an input 72 that may receive the signal OUTSEL and an output 78 that may present an output signal (e.g., DATAOUT). The control signal C<a–n>may be a multi-bit control signal, where one or more of the bits may be presented to the input 62 and one or more of the bits may be presented to the input 76. The one or more bits presented to the input 62 may be the same bits or different bits than the one or more bits that may be presented to the input 76.

Figure 2:
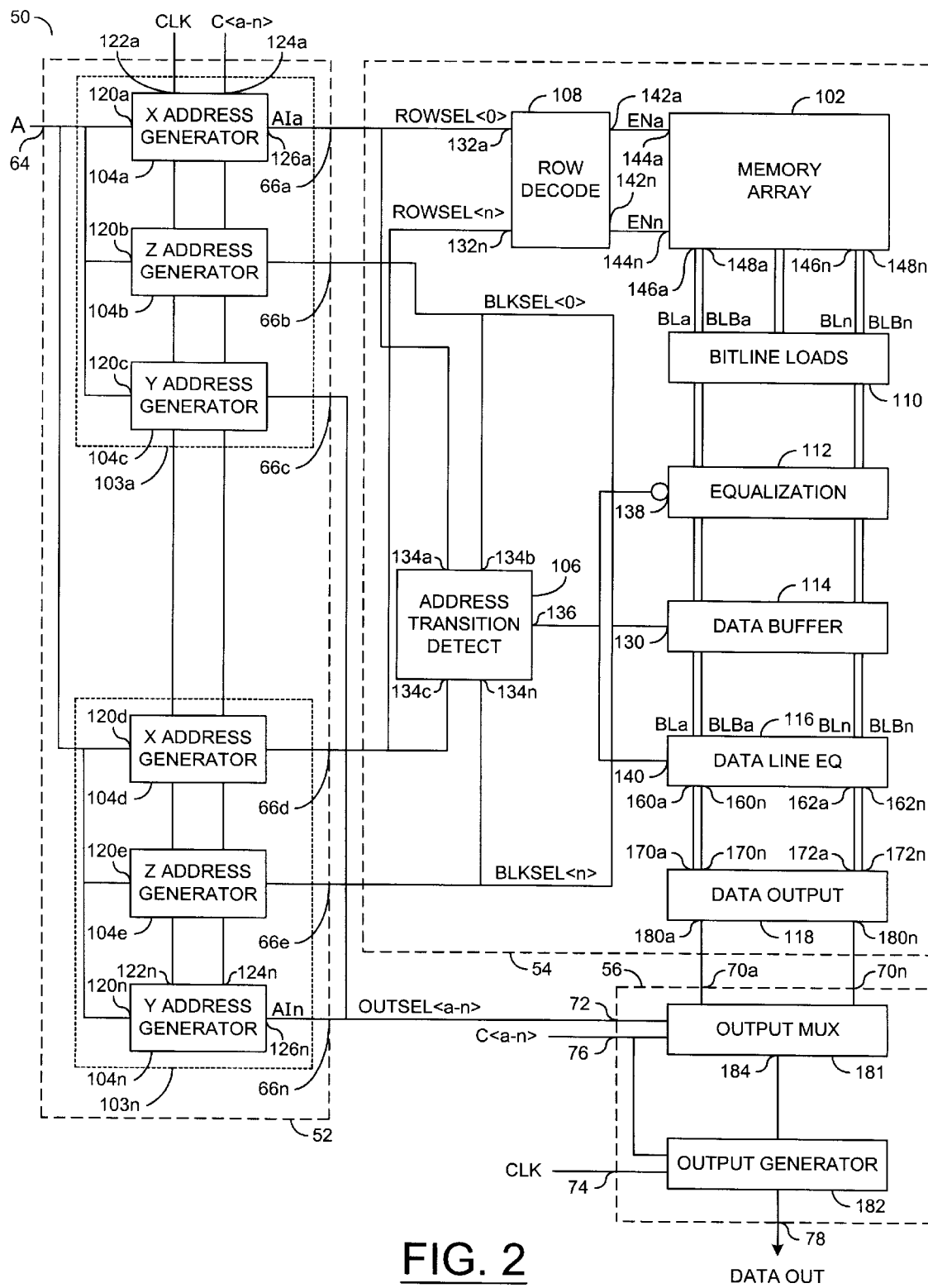
FIG. 2 is a more detailed diagram of the circuit of FIG. 1.
Figure 4:
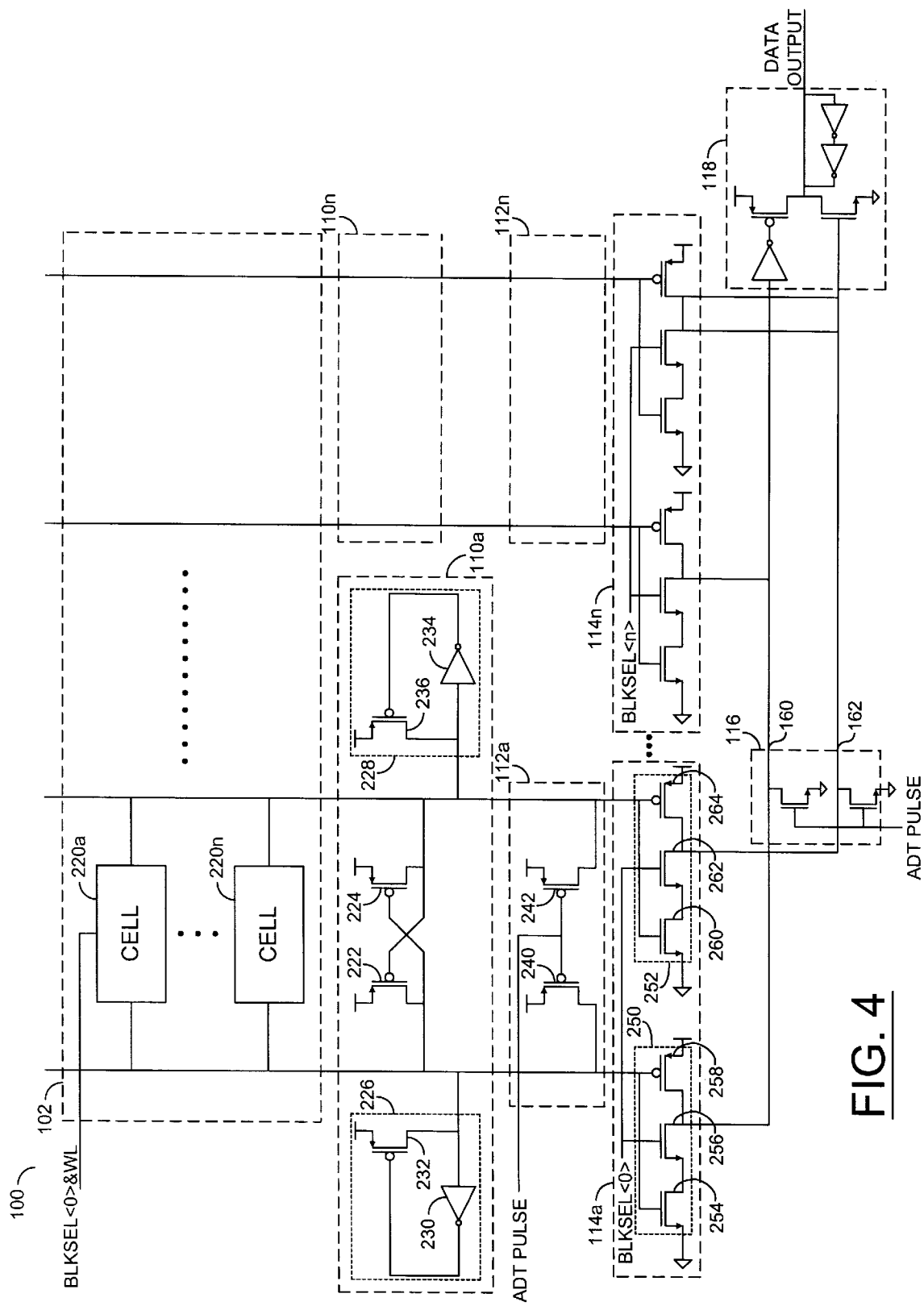
FIG. 4 is a more detailed diagram of a portion of the circuit of FIG. 2.

Referring to FIG. 2, a more detailed diagram of the circuit 50 is shown. The memory section 54 generally comprises a memory array 102, an address transition detect (ATD) block (or circuit) 106, a row decode block (or circuit) 108, a bitline load block (or circuit) 110, an equalization block (or circuit) 112, a data buffer block (or circuit) 114, a data line equalization block (or circuit) 116 and a data output block (or circuit) 118.

The address generator block 52 generally comprises a number of address generators 103a–103n. Each of the address generators 103a–103n generally comprises an X address generator (e.g., 104a), a Z address generator (e.g., 104b) and a Y address generator (e.g., 104c). The address generator blocks 104a–104n may each have an input 120a–120n that may receive the external address A, an input 122a–122n that may receive the external clock signal CLK, an input 124a–124n that may receive the configuration signal C<a–n>, and an output 126a-126n that may present an internal address signal (e.g., AIa–AIn). The internal address signals AIa–AIn presented from the Z address generators generally comprise a number of select signals (e.g., BLKSEL<0>–BLKSEL<n>) that may be presented to an input 130 of the data buffer block 114. The internal address signals AIa–AIn presented from the X address generators generally comprise a number of select signal (e.g., ROWSEL<0>–ROWSEL<n>) that may be presented to a number of inputs 132a–132n of the row decode block 108.

The address transition detect block 106 generally comprises a number of inputs 134a–134n that may receive the internal address signals AIa–AIn from the X address generators and the Y address generators. The address transition detect block 106 may also comprise an output 136 that may present a control signal (e.g., an address transition detect signal ATD). The signal ATD may be generated in response to a transition of one of the internal address signals AIa–AIn. The signal ATD is generally presented to an input 138 of the equalization block 112 as well as to an input 140 of the data line equalization block 116. The input 138 is generally shown having an inverter, which generally provides a digital complement (e.g., ATDb) of the signal ATD to the input 138.

The row decoder block 108 generally presents a number of enable signals (e.g., ENa–ENn) at a number of outputs 142a–142n. A number of inputs 144a–144n of the memory array 142 may receive the enable signals ENa–ENn. The enable signals ENa–ENn generally enable a particular row of the memory array 102 in response to one of the row select signals ROWSEL<a>–ROWSEL<n>. The memory array 102 generally presents a number of bitlines (e.g., BLa–BLBa through BLn–BLBn) at a number of outputs 146a–146n and 148a–148n. Data is generally written to or read from the memory array 142 when a voltage difference occurs on a particular bitline pair (e.g., bitlines BLa and BLBa). In general, the bitline pairs BLa–BLBa through BLn–BLBn run through the bitline load block 110, the equalization block 112 and to the data buffer block 114. One block of the bitlines generally is presented from the data line equalization circuit 116 to the data output circuit 118. One block of data outputs is generally presented from the data output block 118.

The bitline load block 110 generally shuts off when a line of a bitline pair BLa–BLBa through BLn–BLBn pulls low so that little or no DC current is supplied by the loads after the bitline is switched. The equalization circuit 112 generally responds to the signal ATD to provide equalization to the bitlines BLa–BLBa through BLn–BLBn. The data buffer block 114 generally responds to the signals BLKSEL<0>–BLKSEL<n>to select which bitline pair BLa–BLBa through BLn–BLBn that is reading or writing data to the memory array 102. The data line equalization circuit 106 generally responds to the address transition detect signal ATD to pre-set the data lines to a known state. The data output block 118 may have inputs 170a–170n and inputs 172a–172n that generally receive the signals presented at the outputs 160a–160n and 162a–162n of the 20 data line equalization circuit 116. The data output block 118 7 generally presents a signal at output 180a–180n in response to the signals received at the inputs 170a–170n and 172a–172n.

The output section 56 generally comprises an output multiplexer 181 and an output generator 182. The output multiplexer generally receives the control signal C<a–n>and the signal OUTSEL<a–n>from the Y address generators 104a–104n. The output multiplexer 181 may have an output 184 that presents a signal in response to the control signal C<a–n>and the signal OUTSEL<a–n>. The output multiplexer 181 generally configures the word-width of the signal DATAOUT in response to the control signal C<a–n>and the clock signal CLK. The output multiplexer block 181 may receive the output from each data output block 118 and may select which outputs are sent based on the address inputs. The configuration signal C<a–n>, may select the word-width of the block (e.g., ×1, ×4, ×8, ×16 or ×36). The output generator block 182 may receive the output (s) from the output multiplexer block 181 and may generate an asynchronous or a synchronous data output based on the configuration signal C<a–n>and the clock signal CLK (to be described in more detail in connection with FIG. 3). The output multiplexer 181 and the output generator 182 may each receive one or more of the bits of the control signal C<a–n>. The one or more bits received by the output multiplexer 181 may be the same bits or different bits than the one or more bits received by the output generator 182.

The memory array 102 may be designed with a core SRAM device which may be asynchronous having a particular word-width. For example, a word-width of 8-bits may be implemented. However, other word-widths may be implemented to meet the design criteria of a particular implementation. For example, a 32-bit word-width may be implemented. Additional functions may be implemented by the address generator blocks 104a–104n which may control how the inputs and outputs are connected to the memory array 102.

Figure 3:
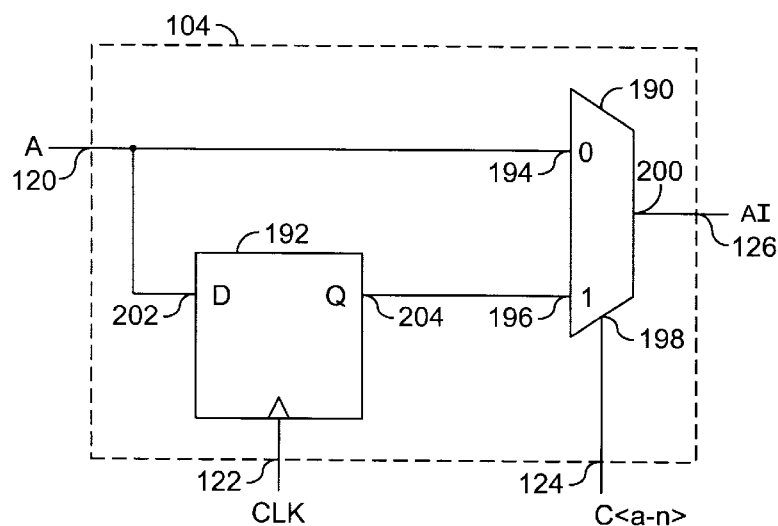
FIG. 3 is a more detailed diagram of one of the address generators of FIG. 2.

Referring to FIG. 3, a more detailed diagram of one of the address generators (e.g., address generator 104) is shown. The address generator 104 generally comprises a multiplexer 190 and a register 192. The multiplexer 190 may comprise an input 194 that may receive the signal A, an input 196 that may receive a signal from the register 192, an input 198 that may receive the control signal C<a–n>and an output 200 that is generally connected to the output 126 and may provide the internal address signal AI. The register 192 generally comprises an input 202 that may receive the external address signal A and an output 204 that generally presents a signal to the input 196 of the multiplexer 190. The external address A may be connected to the internal address AI either asynchronously (e.g., when the signal C<a–n>is low) or synchronously (e.g., when the signal C<a–n>is high). Therefore, the signal C<a–n>may control whether the address is asynchronous or synchronous. The configuration signal C<a–n>may either be an input to the address generator 104, or may be the output of a special memory bit which may be used to hold the desired configuration state. It may be desirable for the asynchronous core (i.e., the memory array 102) to have little or no DC current draw when none of the inputs are switching. The memory array may be implemented as a number of memory cells 220a-220n. The bitlines BLa–BLBa through BLn–BLBn may be implemented as short bitlines. For example, 16 cells may be connected to each pair of bitlines and may be allowed to switch full rail (e.g., from Vss to Vcc). As a result, there may be little or no DC current consumed by the memory cells. Additionally, the short bitlines BLa–BLBa through BLn–BLBn still allow a fast access time. The signal ATD may be used to pre-charge the bitlines BLa–BLBa through BLn–BLBn to VCC after an address change has been detected.

The bitline load block 110 generally comprises a cross-coupled pair of transistors 222 and 224 as well as a half-latch 226 and a half-latch 228. The cross-coupled transistors 222 and 224 may be implemented as PMOS devices. The half-latch 226 generally comprises an inverter 230 and a PMOS device 232. Similarly, the half-latch 228 generally comprises an inverter 234 and a PMOS device 236. Alternately, the PMOS devices 222, 224, 232 and 236 may be implemented as NMOS devices.

The cross-coupled PMOS devices 222 and 224 and the half-latches 226 and 228 may be used as bitline loads. The cross-coupled devices 222 and 224 and the half-latches 226 and 228 generally shut off when a particular bitline pulls low. As a result, little or no DC current is supplied by the loads after the bitline is switched.

The equalization circuit 112 is shown implemented with a PMOS device 240 and a PMOS device 242. Alternatively, NMOS devices may be implemented, with the polarity of the signal ATD inverted, such as with an inverter.

The data buffer block 114a–114n may be implemented as a tri-state buffer 250 and a tri-state buffer 252. The tri-state buffer 250 may be implemented as an NMOS device 254, an NMOS device 256 and an PMOS 258. Similarly, the tri-state buffer 252 may be implemented as an NMOS device 260, an NMOS device 262 and a PMOS device 264. However, other tri-state buffers may be implemented accordingly to meet the design criteria of a particular implementation. The data buffer circuits 114a–114n may be implemented in place of a traditional sense-amplifier. For example, if the tri-stating buffers 250 and 252 are implemented with a high trip point, and are used on each bitline pair BLa–BLBa through BLn–BLBn, the tri-state buffer outputs from each set of bitlines may be shorted together and drive the data output buffers 118. In general, only one set of bitline tri-state buffers 114a114 is selected so that only one set of bitline tri-state buffers drives the data output buffers 118.

The present invention may provide the flexibility to be implemented in embedded systems. All of the operational modes (i.e., (i) asynchronous inputs and outputs, (ii) synchronous inputs (e.g., synchronous flowthrough), (iii) synchronous outputs, (iv) synchronous inputs and outputs (e.g., pipelined), (v) a number of bit widths (e.g., ×32, ×16, ×8, ×4, ×2, ×1), (vi) a Read Only Memory (ROM) mode, and/or (vii) a mode implementing a logic function) may be easily configurable within the circuit 50. The circuit 100 may be used for many more functions than just as a memory storage area (e.g., a logic function implementation is possible).

One example of the circuit 50 may use a 1024×8 asynchronous core as the memory array 102. However, any depth/width memory may be used to implement the memory array 102. However, the word-width of the core memory (e.g., ×8 in one example) may be the maximum word-width available for a particular configuration.

Implementing the circuit 50 with a fully CMOS datapath generally allows both a high speed operation along with a minimal or zero DC power consumption when the inputs are not switching. Additionally, the circuit 100 may allow an embedded memory to be used for many different applications which require synchronous memory, asynchronous memory, read-only memory, or random logic functions. The present invention may give a user the flexibility to use the embedded memory block in a number of configurations.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a memory comprising a plurality of storage elements each configured to store data in response to one of a plurality of internal address signals;
    a plurality of address circuits each configured to generate one of said plurality of internal address signals in response to (i) an external address signal, (ii) a clock signal and (iii) a control signal; and
    an output circuit configured to present an output having a variable word-width in response to said control signal.

2. The circuit according to claim 1, wherein said output circuit is further configured to present either a synchronous or an asynchronous output in response to (i) said clock signal, (ii) said control signal and (iii) data read from one or more of said plurality of storage elements.

3. The circuit according to claim 1, further comprising:
    an address transition detect circuit configured to precharge a number of bitlines in response to a transition of one of said plurality of internal address signals.

4. The circuit according to claim 1, further comprising a plurality of bitline loads, each connected to one of a plurality of bitline pairs, wherein said bitline loads reduce the DC power consumed by the circuit.

5. The circuit according to claim 4, wherein each of said bitline loads comprises a half-latch.

6. The circuit according to claim 4, wherein each of said bitline loads comprises a first and a second cross-coupled gate.

7. The circuit according to claim 4, wherein each of said bitline loads comprises (i) a half-latch and (ii) a first and a second cross-coupled gate.

8. The circuit according to claim 4, wherein said bitline loads reduce the DC power to a zero standby current.

9. The circuit according to claim 4, wherein said bitlines have a full rail switching.

10. The circuit according to claim 1, wherein said circuit comprises an embedded memory.

11. The circuit according to claim 4, further comprising a plurality of data buffers each connected to one of said bitline pairs.

12. The circuit according to claim 4, further comprising a plurality of data line equalization circuits each coupled to one of a number of data line pairs.

13. The circuit according to claim 12, further comprising a data output circuit configured to present a data output in response to said first and second outputs of a data buffer.

14. The circuit according to claim 1, wherein said circuit operates as a random access memory (RAM), read only memory (ROM) or a logic circuit, in response to said control signal.

15. The circuit according to claim 1, wherein said circuit further comprises a plurality of bitline loads, an equalization circuit, a data buffer circuit, a data line equalization circuit and a data output circuit, each fabricated using CMOS transistors.

16. A circuit comprising:
    means for storing data in a plurality of storage elements in response to one of a plurality of internal address signals;
    means for generating each of said plurality of internal address signals in response to (i) an external address signal, (ii) a clock signal and (iii) a control signal; and
    means for generating an output having a variable word-width in response to said control signal.

17. A method for reading and writing data to a plurality of storage elements comprising the steps of:
    (A) configuring each of said storage elements to store data in response to one of a plurality of internal address signals;
    (B) generating each of said plurality of internal address signals in response to (i) an external address signal, (ii) a clock signal and (iii) a control signal; and
    (C) generating an output having a variable word-width in response to said control signal.

18. The method according to claim 17, further comprising the step of:
    (D) precharging a number of bitlines in response to a transition of one of said internal address signals.

19. The method according to claim 17, wherein said plurality of storage elements can be configured as a random access memory (RAM), read only memory (ROM) or a logic circuit, in response to said control signal.

20. An apparatus comprising:
    a memory comprising a plurality of storage elements each configured to store data in response to one of a plurality of internal address signals;
    a plurality of address circuits each configured to generate one of said plurality of internal address signals in response to (i) an external address signal, (ii) a clock signal and (iii) a control signal; and
    an address transition detect circuit configured to precharge a number of bitlines in response to a transition of one of said plurality of internal address signals.

* * * * *